US012591327B2

(12) United States Patent
Liu

(10) Patent No.: US 12,591,327 B2
(45) Date of Patent: Mar. 31, 2026

(54) DISPLAY PANEL, PREPARATION METHOD THEREOF, AND DISPLAY DEVICE

(71) Applicant: Xiamen Extremely PQ Display Technology Co., Ltd., Xiamen (CN)

(72) Inventor: Tung-Kai Liu, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/795,269

(22) Filed: Aug. 6, 2024

(65) Prior Publication Data

US 2024/0393895 A1 Nov. 28, 2024

Related U.S. Application Data

(63) Continuation of application No. PCT/CN2022/094012, filed on May 20, 2022.

(51) Int. Cl.
*G06F 3/041* (2006.01)
*G06F 3/044* (2006.01)
*H10H 20/01* (2025.01)
*H10H 20/856* (2025.01)
*H10W 90/00* (2026.01)

(52) U.S. Cl.
CPC ............ *G06F 3/0412* (2013.01); *G06F 3/044* (2013.01); *H10H 20/856* (2025.01); *H10W 90/00* (2026.01); *G06F 2203/04103* (2013.01); *H10H 20/0363* (2025.01)

(58) Field of Classification Search
CPC ........ G06F 3/044; G06F 3/0412; G06F 3/041;
G06F 2203/04103; H01L 25/0753; H01L
25/167; H10H 20/855; H10H 20/856;
H10H 20/857; H10H 29/10; H10H
20/0363
See application file for complete search history.

(56) References Cited

U.S. PATENT DOCUMENTS

2018/0092173 A1* 3/2018 Wu ..................... H01L 25/0753

FOREIGN PATENT DOCUMENTS

| | | | | |
|---|---|---|---|---|
| CN | 107331680 A | 11/2017 | | |
| CN | 109213360 A | 1/2019 | | |
| CN | 110147179 A | 8/2019 | | |
| CN | 110162203 A | * 8/2019 | ........ | G06V 40/1318 |
| CN | 110690243 A | 1/2020 | | |
| CN | 111580695 A | 8/2020 | | |
| CN | 112114703 A | 12/2020 | | |
| CN | 112259006 A | 1/2021 | | |
| CN | 112349744 A | 2/2021 | | |
| CN | 114115605 A | 3/2022 | | |
| JP | 2020205417 A | 12/2020 | | |

* cited by examiner

*Primary Examiner* — Yaron Cohen
(74) *Attorney, Agent, or Firm* — Hemisphere Law, PLLC

(57) ABSTRACT

A display panel, a preparation method thereof, and a display device are provided. The display panel includes a display substrate and a capacitive touch sensing structure. The display substrate includes a driving array layer and multiple micro light-emitting devices, and the multiple micro light-emitting devices are in contact with and electrically connected to the driving array layer. The capacitive touch sensing structure is located at a side of the driving array layer adjacent to the multiple micro light-emitting devices and spaced apart from the multiple micro light-emitting devices, and is electrically connected to the driving array layer. It has the characteristics of simple structure, low cost and accurate sensing.

16 Claims, 5 Drawing Sheets

Providing a display substrate, where the display substrate comprises a driving array layer and a plurality of micro light-emitting devices, and the plurality of micro light-emitting devices are in contact with and electrically connected to the driving array layer

∖ S1

Forming a capacitive touch sensing structure on a side of the display substrate adjacent to the plurality of micro light-emitting devices to make the capacitive touch sensing structure be spaced apart from the plurality of micro light-emitting devices and be electrically connected to the driving array layer, so as to obtain the display panel

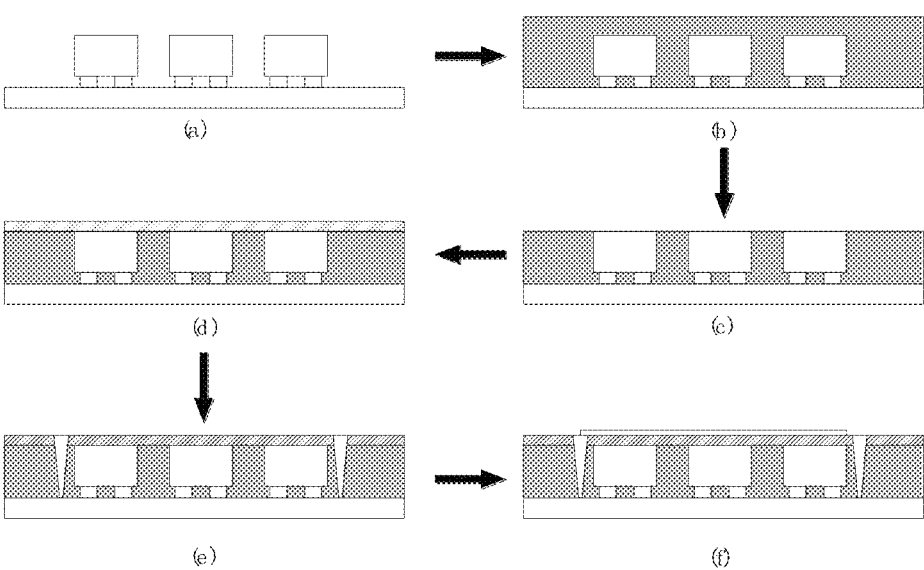

DISPLAY PANEL, PREPARATION METHOD THEREOF, AND DISPLAY DEVICE

CROSS-REFERENCE TO RELATED APPLICATIONS

This application is a continuation of International Application No. PCT/CN2022/094012, filed on May 20, 2022. The international Application claims priority to Chinese patent application No. 202280001324.X, filed to China National Intellectual Property Administration (CNIPA) on May 20, 2022. The entire contents of the above-mentioned applications are incorporated herein by reference.

TECHNICAL FIELD

The disclosure relates to the field of display technologies, and more particularly to a display panel, a preparation method thereof, and a display device.

BACKGROUND

Micro-light-emitting diode (micro-LED) display technology is widely applied to various display devices, and the display devices typically require touchscreen functionality. The existing touch screen production processes are mainly divided into in-cell touch and on-cell touch. The in-cell touch process is commonly used on liquid crystal display (LCD) or organic light-emitting diode (OLED) display. When the existing in-cell touch structure is applied to micro-LED displays, it is prone to inaccuracies in determining a position of a touch object due to parasitic capacitance inherent in micro-LEDs. In addition, the on-cell touch process requires fabrication of sensing circuits or electrodes on an external glass substrate, which presents issues such as high production costs and complex manufacturing processes. Therefore, the existing micro-LED touch display panels have the problem of not being compatible with high precision and low difficulty.

Therefore, it is urgent to provide a new solution to solve at least some problems of the above-described micro-LED touch panel.

SUMMARY

In order to overcome at least some defects in the related art, embodiments of the disclosure provide a display panel, a preparation method of the display panel, and a display device, which have the characteristics of low cost and accurate sensing.

In an aspect, an embodiment of the disclosure provides a display panel, including a display substrate and a capacitive touch sensing structure. The display substrate includes a driving array layer and multiple micro light-emitting devices, and the multiple micro light-emitting devices are in contact with and electrically connected to the driving array layer. The capacitive touch sensing structure is located at a side of the driving array layer adjacent to the multiple micro light-emitting devices and spaced apart from the multiple micro light-emitting devices, and the capacitive touch sensing structure is electrically connected to the driving array layer.

In an embodiment, the display panel further includes a light-shielding layer, which is arranged between the multiple micro light-emitting devices and exposes sides of the multiple micro light-emitting devices facing away from the driving array layer.

In an embodiment, the display panel further includes a planarization layer and conductive through-holes. The planarization layer covers the light-shielding layer and the sides of the multiple micro devices facing away from the driving array layer. The conductive through-holes penetrate the planarization layer and the light-shielding layer and extend to the driving array layer. The capacitive touch sensing structure includes a transparent sensing circuit layer, which covers a side of the planarization layer facing away from the light-shielding layer and is electrically connected to the driving array layer through the conductive through-holes.

In an embodiment, the capacitive touch sensing structure is arranged in the light-shielding layer and between the multiple micro light-emitting devices. Alternatively, the capacitive touch sensing structure is arranged on a side of the light-shielding layer facing away from the driving array layer and between the multiple micro light-emitting devices.

In an embodiment, the light-shielding layer includes multiple isolation columns protruding from the driving array layer along a direction close to sides of the micro light-emitting devices, and one isolation column of the multiple isolation columns is correspondingly arranged between any two adjacent micro light-emitting devices of the multiple micro light-emitting devices, and a height of each of the multiple isolation columns protruding from the driving array layer is not less than that of the multiple micro light-emitting devices protruding from the driving array layer.

In an embodiment, the capacitive touch sensing structure is correspondingly arranged on a side of a target isolation column of the multiple isolation columns facing away from the driving array layer.

In an embodiment, the multiple isolation columns are made of light reflecting materials.

In another aspect, an embodiment of the disclosure provides a preparation method of the display panel, which includes the following steps: providing a display substrate, wherein the display substrate comprises a driving array layer and multiple micro light-emitting devices, and the multiple micro light-emitting devices are in contact with and electrically connected to the driving array layer; and forming a capacitive touch sensing structure on a side of the display substrate adjacent to the multiple micro light-emitting devices to make the capacitive touch sensing structure be spaced apart from the multiple micro light-emitting devices and be electrically connected to the driving array layer, so as to obtain the display panel.

In an embodiment, the preparation method of the display panel further includes the follow step: manufacturing a light-shielding layer between the multiple micro light-emitting devices and exposing sides of the multiple micro light-emitting devices facing away from the driving array layer.

In an embodiment, the manufacturing a light-shielding layer between the multiple micro light-emitting devices and exposing sides of the multiple micro light-emitting devices facing away from the driving array layer includes: covering a light-shielding film on the sides of the multiple micro light-emitting devices facing away from the driving array layer and making the light-shielding film expose the sides of the multiple micro light-emitting devices facing away from the driving array layer to form the light-shielding layer; or filling a light-shielding material liquid between the multiple micro light-emitting devices, making the light-shielding material liquid expose the sides of the multiple micro light-emitting devices facing away from the driving array layer, and curing the light-shielding material liquid to form the light-shielding layer.

In an embodiment, the preparation method of the display panel further includes: manufacturing a planarization layer on a side of the light-shielding layer facing away from the driving array layer. The step of forming a capacitive touch sensing structure on a side of the display substrate adjacent to the multiple micro light-emitting devices to make the capacitive touch sensing structure be spaced apart from the multiple micro light-emitting devices and be electrically connected to the driving array layer includes forming conductive through-holes penetrating through the planarization layer and the light-shielding layer; and covering a transparent sensing circuit layer on a side of the planarization layer facing away from the light-shielding layer, and making the transparent sensing circuit layer be electrically connected to the driving array layer through the conductive through-holes, thereby forming the capacitive touch sensing structure.

In an embodiment, the step of forming a capacitive touch sensing structure on a side of the display substrate adjacent to the multiple micro light-emitting devices to make the capacitive touch sensing structure be spaced apart from the multiple micro light-emitting devices and be electrically connected to the driving array layer includes forming the capacitive touch sensing structure between two adjacent target micro light-emitting devices of the multiple micro light-emitting devices.

In an embodiment, the preparation method of display panel further includes forming a multiple isolation columns on the light-shielding layer, making one isolation column the multiple isolation columns be formed between any two adjacent micro light-emitting devices of the multiple micro light-emitting devices, and a height of each of the multiple isolation columns protruding from the driving array layer be not less than that of the multiple micro light-emitting devices protruding from the driving array layer.

In an embodiment, the step of forming the capacitive touch sensing structure between two adjacent target micro light-emitting devices of the multiple micro light-emitting devices includes forming the capacitive touch sensing structure on a side of a target isolation column of the multiple isolation columns facing away from the driving array layer.

In still another aspect, an embodiment of the disclosure provides a display device, including the display panel described in any one of the foregoing embodiments, or including the display panel prepared by the preparation method described in any one of the foregoing embodiments.

The above embodiments of the disclosure have at least one or more beneficial effects as follows. The capacitive touch sensing structure is arranged on the same side of the driving array layer as the multiple micro light-emitting devices, and the capacitive touch sensing structure is arranged on a top surface of the multiple micro light-emitting devices facing away from the driving array layer or among the multiple micro light-emitting devices to surround the multiple micro light-emitting devices. This arrangement prevents the capacitive touch sensing structure from being affected by the parasitic capacitance of the micro light-emitting devices, thus avoiding inaccurate judgment, which is less challenging and lower in cost compared with the on-cell touch process.

Other aspects and features of the disclosure become apparent from the following detailed description with reference to the accompanying drawings. However, it should be understood that the drawings are designed for illustrative purposes only and are not intended to limit the scope of the disclosure. It should also be understood that, unless otherwise indicated, the drawings are not necessarily drawn to scale, but merely attempt to conceptually illustrate the structures and processes described herein.

BRIEF DESCRIPTION OF DRAWINGS

The specific embodiments of the disclosure will be described in detail with reference to the attached drawings.

FIG. 9 illustrates a schematic flow block diagram of a preparation method of a display panel according to an embodiment of the disclosure.

FIG. 10 illustrates a schematic flowchart of a preparation method of a display panel according to an embodiment of the disclosure.

DESCRIPTION OF REFERENCE SIGNS

100: display device; 10: display panel; 11: display substrate; 111: driving array layer; 112: multiple micro light-emitting devices; 12: capacitive touch sensing structure; 121: transparent sensing circuit layer; 13: light-shielding layer; 131: isolation column; 14: planarization layer; 15: conductive through-holes.

DETAILED DESCRIPTION OF EMBODIMENTS

In order to make the above objects, features and advantages of the disclosure more obvious and understandable, specific embodiments of the disclosure will be described in detail with the attached drawings.

In order to make those skilled in the art better understand the technical solutions of the disclosure, the technical solutions in the embodiments of the disclosure will be clearly and completely described below in conjunction with the attached drawings. Apparently, the described embodiments are only some of the embodiments of the disclosure, but not all of the embodiments. Based on the embodiments in the disclosure, all other embodiments obtained by those skilled in the art without creative work should belong to the protection scope of the disclosure.

It should be noted that the terms "first", "second", and the like in the description and claims of the disclosure and the drawings are used to distinguish similar objects, and are not necessarily used to describe a specific order or precedence. It should be understood that the terms so used may be interchangeable under appropriate circumstances, so that the embodiments of the disclosure described herein can be implemented in other orders than those illustrated or described herein. Furthermore, the terms "including" and "having" and any variations thereof are intended to cover a non-exclusive inclusion, for example, a process, a method, a system, a product, or an apparatus that includes a series of steps or elements is not necessarily limited to those explicitly listed, but may include other steps or elements not explicitly listed or inherent to the process, the method, the product, or the apparatus.

It should also be noted that the division of multiple embodiments in the disclosure is only for the convenience of description, and should not constitute a special limitation. The features in various embodiments can be combined and referred from each other without contradiction.

First Embodiment

Figure 1:
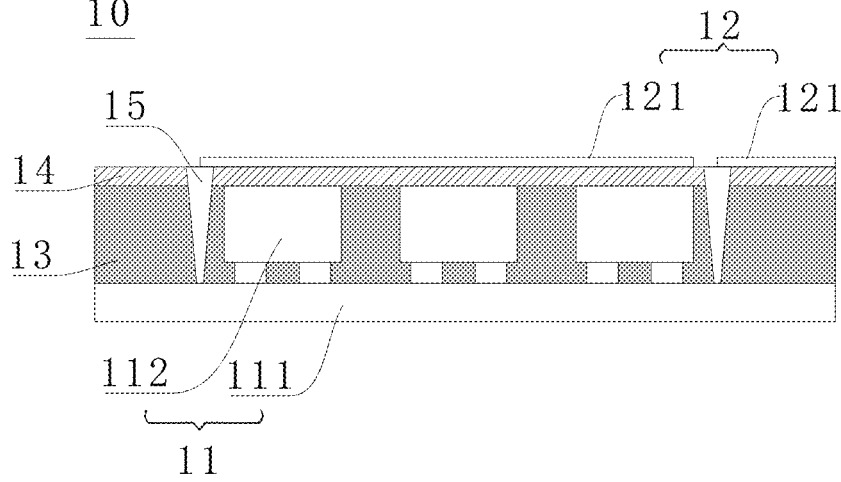
FIG. 1 illustrates a schematic structural view of a display panel according to a first embodiment of the disclosure.

As shown in FIG. 1, the first embodiment of the disclosure provides a display panel 10, and the display panel 10 includes, for example, a display substrate 11, a capacitive touch sensing structure 12, a light-shielding layer 13 and a planarization layer 14. The display substrate 11 includes a driving array layer 111 and multiple micro light-emitting devices 112, and the multiple micro light-emitting devices 112 are in contact with and electrically connected to the driving array layer 111. The light-shielding layer 13 is disposed between the multiple micro light-emitting devices 112 and exposes sides of the multiple micro light-emitting devices 112 facing away from the driving array layer 111. The planarization layer 14 covers the light-shielding layer 13 and the sides of the multiple micro light-emitting devices 112 facing away from the driving array layer 111. Conductive through-holes 15 are formed on the display substrate 11, which penetrate through the planarization layer 14 and the light-shielding layer 13 and extend to the driving array layer 111. The capacitive touch sensing structure 12 is located on a side of the driving array layer 111 adjacent to the multiple micro light-emitting devices 112, and is spaced apart from the multiple micro light-emitting devices 112, and the capacitive touch sensing structure 12 is electrically connected to the driving array layer 111. Specifically, in this embodiment, the capacitive touch sensing structure 12 includes transparent sensing circuit layers 121, which cover a side of the planarization layer 14 facing away from the light-shielding layer 13 and are electrically connected to the driving array layer 111 through the conductive through-holes 15. The planarization layer 14 separates the transparent sensing circuit layers 121 from the micro light-emitting devices 112, that is, the capacitive touch sensing structure 12 is spaced apart from the multiple micro light-emitting devices 112 through the planarization layer 14.

The micro light-emitting device 112 is, for example, a micro-light-emitting diode device, that is, a micro-LED. The driving array layer 111 includes a thin-film transistor (TFT) driving array for driving the micro light-emitting device 112 to emit light. Specifically, the TFT driving array includes, for example, a substrate glass, and a buffer layer, an active layer, a gate insulation layer (a GI layer), a first metal layer, a first passivation layer, a second metal layer, a second passivation layer, a third metal layer and the like sequentially staked in that order on a surface of the substrate glass (not shown in FIG. 1). The active layer, the first metal layer and the second metal layer are used for forming a TFT device structure. The GI layer, the first passivation layer and the second passivation layer are mainly used for insulating isolation among the active layer, the first metal layer and the second metal layer, and the third metal layer can be used for electrical connection with devices other than the driving array layer 111. That is to say, the driving array layer 111 is specifically a TFT driving board used for driving the micro light-emitting devices 112 to emit light, that is, the display substrate 11 refers to the TFT driving array board on which multiple micro light-emitting devices 112 have been soldered. The micro light-emitting devices 112, for example, are specifically soldered on the third metal layer of the driving array layer 111 to be electrically connected to the driving array layer 111. Referring to FIG. 1, the light-shielding layer 13 is, for example, an entire layer of black matrix (BM) film, that is, a black film, or other BM materials. The light-shielding layer 13 is arranged between the multiple micro light-emitting devices 112, the aforementioned light-shielding layer 13 exposes the sides of the micro light-emitting devices 112 facing away from the driving array layer 111, specifically, the light-shielding layer 13 does not shield the sides of the micro light-emitting devices 112 facing away from the driving array layer 111. For example, when the light-shielding layer 13 is the entire layer of BM film, an upper surface of the light-shielding layer 13 is flush with upper surfaces of the micro light-emitting devices 112, and the upper surfaces of the micro light-emitting devices 112 are exposed to block the optical crosstalk between adjacent micro light-emitting devices 112, allowing the multiple micro light-emitting devices 112 to emit light upwards. Alternatively, in some implementations, when a height of the light-shielding layer 13 is greater than that of the micro light-emitting device 112, the upper surface of the micro light-emitting device 112 needs to be hollowed out to expose the surface of the micro light-emitting device 112 to the light-shielding layer 13 without being shielded. The planarization layer 14 covers the light-shielding layer 13 and the multiple micro light-emitting devices 112 to flatten an upper surface of the display substrate 11, and a thickness between an upper surface of the planarization layer 14 and an upper surface of the driving array layer 111 is in a range of 7-15 micrometers (μm). The conductive through-holes 15, for example, can be formed through a yellow light process or plasma etching. The transparent sensing circuit layer 121 is, for example, an indium tin oxide (ITO) film, which is used to sense changes in capacitance caused by a touch object. The transparent sensing circuit layer 121, for example, is electrically connected to the third metal layer of the driving array layer 111 through the conductive through-holes 15, so as to transmit a sensing signal to an integrated circuit (IC) chip of the TFT driving board through an internal circuit of the driving array layer 111 to judge a position of a touch signal source, thus achieving the touch recognition function of the touch object. The display panel 10 provided by this embodiment can solve the problem that when the touch sensing circuit is located under the micro-LED in the related art, the internal capacitance value of the micro-LED changes due to the applied current and voltage, which shields or changes the difference of the capacitance value caused by the touch object, thus causing inaccurate judgment. That is, the display panel 10 provided in this embodiment has the effects of simple structure and accurate touch control.

Second Embodiment

Figure 2:
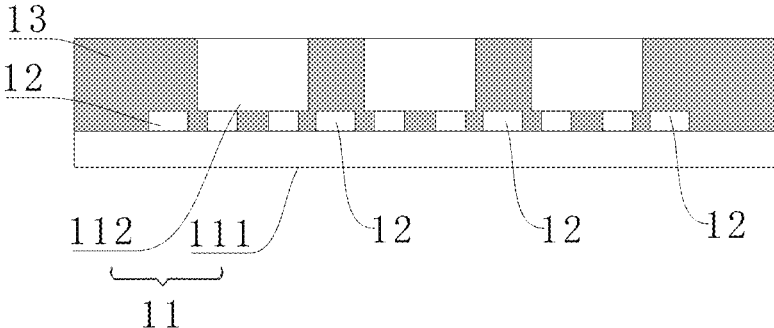
FIG. 2 illustrates a schematic structural view of a display panel according to a second embodiment of the disclosure.

As shown in FIG. 2, the second embodiment of the disclosure provides another display panel 10, which includes, for example, a display substrate 11, a capacitive touch sensing structure 12, and a light-shielding layer 13.

The display substrate 11 includes a driving array layer 111 and multiple micro light-emitting devices 112, and the multiple micro light-emitting devices 112 are in contact with and electrically connected to the driving array layer 111. The light-shielding layer 13 is disposed between the multiple micro light-emitting devices 112 and exposes sides of the multiple micro light-emitting devices 112 facing away from the driving array layer 111. The capacitive touch sensing structure 12 is located on a side of the driving array layer 111 adjacent to the multiple micro light-emitting devices 112, and is spaced apart from the multiple micro light-emitting devices 112, and the capacitive touch sensing structure 12 is electrically connected to the driving array layer 111.

The micro light-emitting device 112 is, for example, a micro-LED. The driving array layer 111 includes a TFT driving array for driving the micro light-emitting device 112 to emit light. Specifically, the TFT driving array includes, for example, a substrate glass, and a buffer layer, an active layer, a GI layer, a first metal layer, a first passivation layer, a second metal layer, a second passivation layer, a third metal layer and the like sequentially staked in that order on a surface of the substrate glass (not shown in FIG. 2). The active layer, the first metal layer and the second metal layer are used for forming a TFT device structure. The GI layer, the first passivation layer and the second passivation layer are mainly used for insulating isolation among the active layer, the first metal layer and the second metal layer, and the third metal layer can be used for electrical connection with devices other than the driving array layer 111. That is to say, the driving array layer 111 is specifically a TFT driving board used for driving the micro light-emitting devices 112 to emit light, that is, the display substrate 11 refers to the TFT driving array board on which multiple micro light-emitting devices 112 have been soldered. The micro light-emitting devices 112, for example, are specifically soldered on the third metal layer of the driving array layer 111 to be electrically connected to the driving array layer 111.

Figure 3:
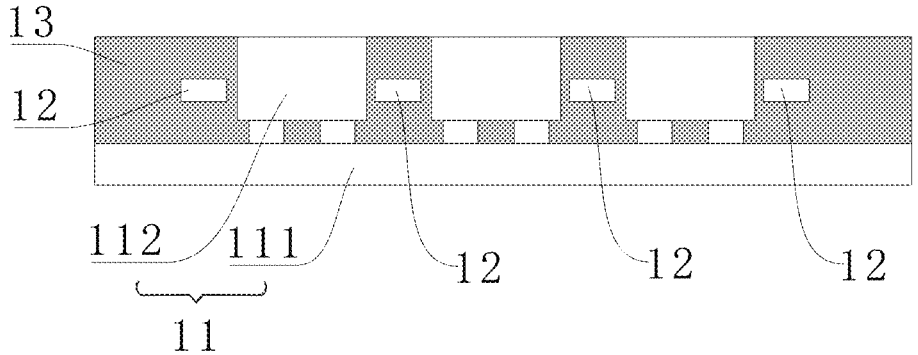
FIG. 3 illustrates a schematic structural view of another display panel according to the second embodiment of the disclosure.
Figure 4:
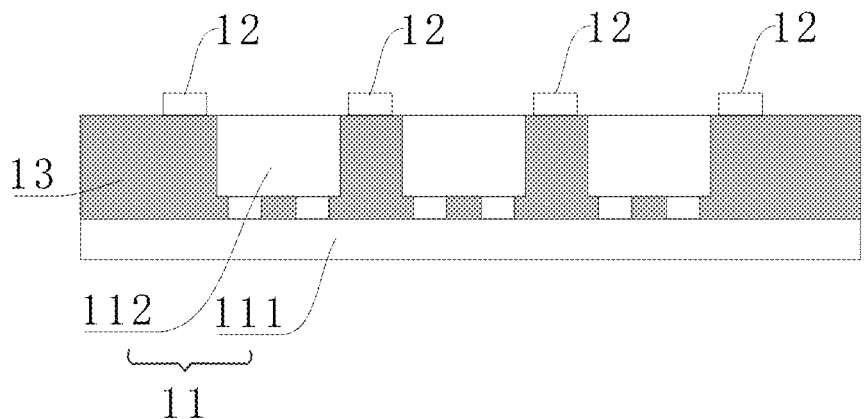
FIG. 4 illustrates a schematic structural view of still another display panel according to the second embodiment of the disclosure.
Figure 8:
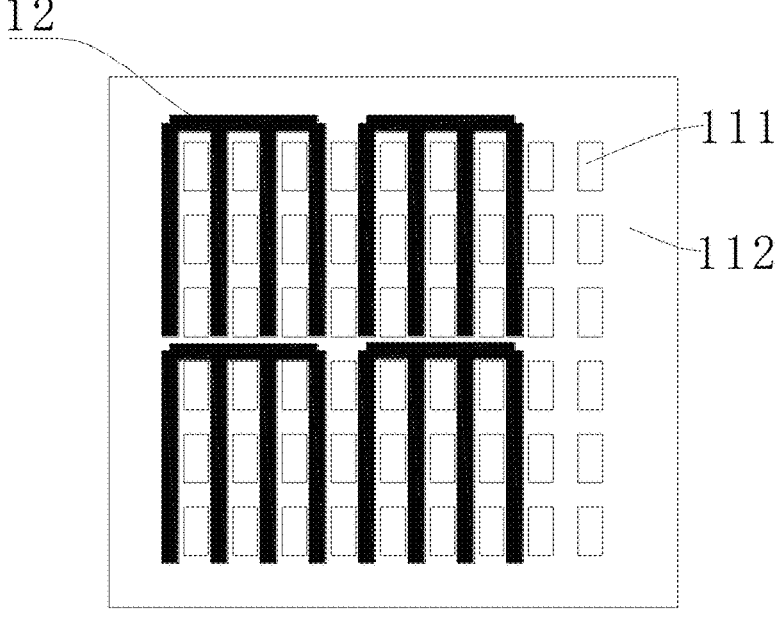
FIG. 8 illustrates a schematic top view of a display panel according to an embodiment of the disclosure.

In an implementation, specifically, the capacitive touch sensing structure 12 is disposed within the light-shielding layer 13 and between the multiple micro light-emitting devices 112. Referring to FIG. 2, the light-shielding layer 13 is, for example, an entire layer of BM film, or other BM materials, and is arranged between the multiple micro light-emitting devices 112, the aforementioned light-shielding layer 13 exposes the sides of the micro light-emitting devices 112 facing away from the driving array layer 111, specifically, the light-shielding layer 13 does not shield the sides of the micro light-emitting devices 112 facing away from the driving array layer 111. For example, when the light-shielding layer 13 is the entire layer of BM film, an upper surface of the light-shielding layer 13 is flush with upper surfaces of the micro light-emitting devices 112, and the upper surfaces of the micro light-emitting devices 112 are exposed to block the optical crosstalk between adjacent micro light-emitting devices 112, allowing the multiple micro light-emitting devices 112 to emit light upwards. Alternatively, in some implementations, when a height of the light-shielding layer 13 is greater than that of the micro light-emitting device 112, the upper surface of the micro light-emitting device 112 needs to be hollowed out to expose the surface of the micro light-emitting device 112 to the light-shielding layer 13 without being shielded. The capacitive touch sensing structure 12 is located between the multiple micro light-emitting devices 112, specifically referring to FIG. 2, for example, the capacitive touch sensing structure 12 is located on a bottom side of the light-shielding layer 13 close to the driving array layer 111. Alternatively, referring to FIG. 3, in another implementation, the capacitive touch sensing structure 12 is, for example, located between an upper surface and a lower surface of the light-shielding layer 13. Alternatively, referring to FIG. 4, in still another implementation, the capacitive touch sensing structure 12 is, for example, located on a top side of the light-shielding layer 13 facing away from the driving array layer 111. When the capacitive touch sensing structure 12 is arranged at a middle position and a top position of the light-shielding layer 13, the variation of the capacitance value of the sensing touch object can be increased, making the touch signal more sensitive and enhancing the sensing sensitivity. The schematic top views of the display panel 10 shown in FIGS. 2, 3, and 4, for example, can refer to FIG. 8, where the capacitive touch sensing structure 12 forms a circuit around the micro light-emitting devices 112, such as forming four sensing regions in FIG. 8. Of course, the regions in FIG. 8 are only an example. The capacitive touch sensing structures 12 with different sensing regions are electrically connected to the third metal layer of the driving array layer 111 through conductive through-holes (not shown in FIG. 2) at different positions in the light-shielding layer 13. In this situation, the sensing signal can be transmitted to an IC chip of the TFT driving board by an internal circuit of the driving array layer 111 to judge a position of a touch signal source, thus achieving the touch recognition function of the touch object. At this time, the capacitive touch sensing structure 12 can be made of ITO or other metal materials, which can not only ensure the light emission of the micro light-emitting devices 112, but also avoid the abnormal judgment caused by the parasitic capacitance of the micro light-emitting devices themselves.

Figure 5:
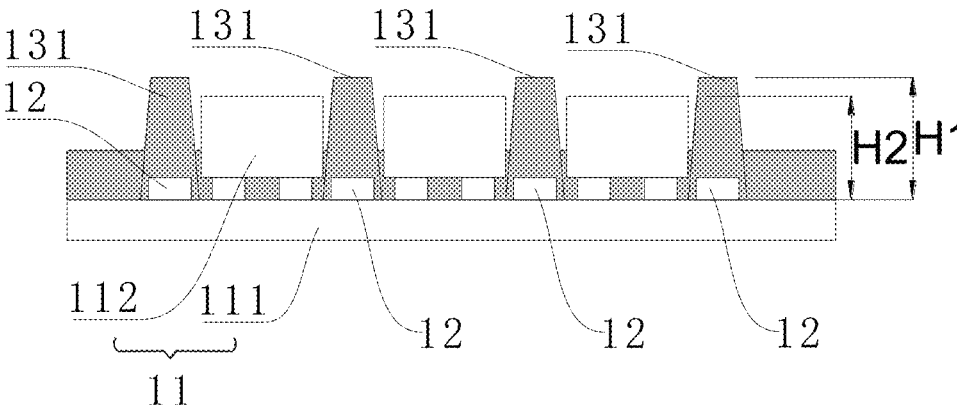
FIG. 5 illustrates a schematic structural view of a specific embodiment of the display panel shown in FIG. 2.

More specifically, in an implementation, the light-shielding layer 13 further includes multiple isolation columns 131 protruding from the driving array layer 111 along a direction close to the sides of the multiple micro light-emitting devices 112, one isolation column 131 is correspondingly arranged between any two adjacent micro light-emitting devices 112, and a height of each isolation column 131 protruding from the driving array layer 111 is not less than that of the multiple micro light-emitting devices 112 protruding from the driving array layer 111. For example, referring to FIG. 5, which is a schematic structural diagram of a specific implementation of the display panel 10 shown in FIG. 2. The light-shielding layer 13 is patterned and etched to form the multiple isolation columns 131. The height of the isolation columns 131 protruding from the driving array layer 111 is, for example, H1 as shown in FIG. 5, and the height of the micro light-emitting device 112 protruding from the driving array layer 111 is, for example, H2 as shown in FIG. 5, where H1 is not less than H2. Alternatively, referring to FIG. 6, which is a schematic structural diagram of a specific implementation of the display panel 10 shown in FIG. 4. The capacitive touch sensing structure 12 is correspondingly arranged on a side of a target isolation column of the multiple isolation columns 131 facing away from the driving array layer 111. The capacitive touch sensing structure 12 is arranged on a top of the target isolation column. For example, referring to the top view of FIG. 8, the capacitive touch sensing structure 12 is arranged on the isolation column 131 between the first column and the second column of the first row of the micro light-emitting devices 112, that is, the isolation column 131 is the aforementioned target isolation column. However, there is no capacitive touch sensing structure 12 on the isolation column between the micro light-emitting devices 112 in the first row and the first column in the second row and the micro light-emitting devices 112 in the second row and the first column, which is not the target isolation column. The crosstalk between adjacent micro light-emitting devices 112 is blocked by the isolation columns 131, and the upper surfaces of the micro light-emitting devices 112 are exposed, so that the micro light-emitting devices 112 emit light upwards. Further, referring to FIG. 7, which is a schematic diagram of a specific implementation of FIG. 6, in which the isolation column 131 is made of light reflecting material, so that the light emitted by the micro light-emitting devices 112 can be recovered as much as possible.

Third Embodiment

The third embodiment of the disclosure provides a preparation method of a display panel. Referring to FIG. 9, the preparation method of the display panel provided by this embodiment may include step S1 and step S2. In the step S1, a display substrate is provided, the display substrate includes a driving array layer and multiple micro light-emitting devices, and the multiple micro light-emitting devices are in contact with and electrically connected to the driving array layer. In the step S2, a capacitive touch sensing structure is formed on a side of the display substrate adjacent to the multiple micro light-emitting devices, so that the capacitive touch sensing structure is spaced apart from the multiple micro light-emitting devices and electrically connected to the driving array layer.

The display substrate provided in the step S1 may have the same structure as the display substrate 11 described in the first embodiment and the second embodiment, which will not be described in detail herein. In a specific implementation, the preparation method further includes step S3 between the step S1 and the step S2, in the step S3, a light-shielding layer is manufactured between the multiple micro light-emitting devices and sides of the micro light-emitting devices facing away from the driving array layer are exposed.

In a specific implementation, the preparation method further includes step S4 between step S3 and step S2, in the step S4, a planarization layer is manufactured on a side of the light-shielding layer facing away from the driving array layer. A surface of the light-shielding layer is planarized through the step S4, and then step S2 is executed. The step S2 specifically includes step S21 and step S22. In the step S21, conductive through-holes penetrating through the planarization layer and the light-shielding layer are formed. In the step S22, transparent sensing circuit layers are covered on a side of the planarization layer facing away from the light-shielding layer, so that the transparent sensing circuit layers are electrically connected to the driving array layer through the conductive through-holes, and the transparent sensing circuit layers form the capacitive touch sensing structure.

In the step S21, the conductive through-holes may be formed by a yellow light process or plasma etching. The step S3 may specifically include step S31, in the step S31, the sides of the multiple micro light-emitting devices facing away from the driving array layer are covered with a light-shielding film and the sides of the micro light-emitting devices facing away from the driving array layer are exposed to form the light-shielding layer. Specifically, for example, after covering the light-shielding film, a polisher or a chipper is used for polishing to remove the redundant part, so that upper surfaces of the micro light-emitting devices are exposed from the light-shielding layer without being shielded. The preparation steps of the display panel in this embodiment may be shown in steps (a) to (f) in FIG. 10, including: (a) providing the display substrate→(b) covering the light-shielding film→(c) polishing to form the light-shielding layer→(d) manufacturing the planarization layer→(e) forming the conductive through-holes→(f) covering the transparent sensing circuit layers.

Figure 11:
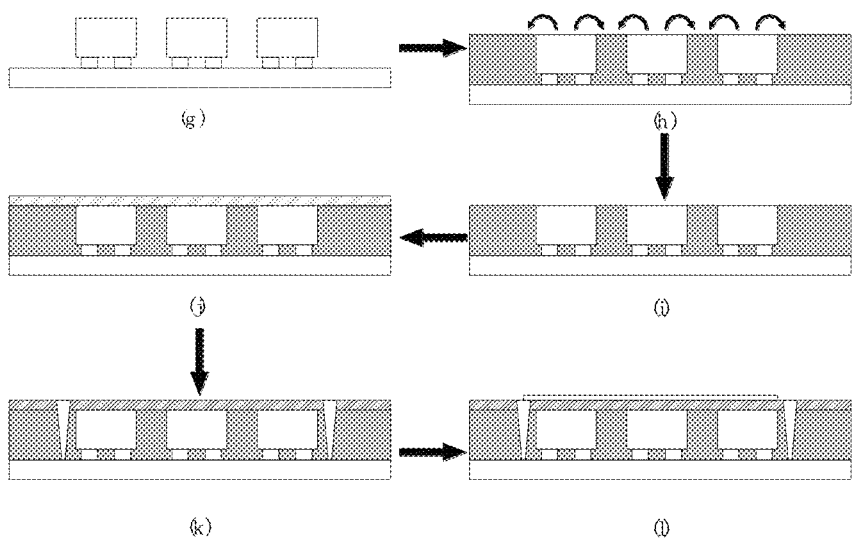
FIG. 11 illustrates a schematic flowchart of a preparation method of a display panel according to another embodiment of the disclosure.

Alternatively, in another implementation, step S3 may specifically include step S32, in the step S32, a light-shielding material liquid is filled between the micro light-emitting devices, thereby making the light-shielding material liquid expose the sides of the micro light-emitting devices facing away from the driving array layer, and the light-shielding material liquid is cured to form the light-shielding layer. Specifically, the light shielding material liquid is selected as a material which is liquid in a heated state and has high fluidity, with the function of cohesion. For example, the light-shielding material liquid is coated on the micro light-emitting devices in a dripping or spin coating manner, so that the light-shielding material liquid does not remain on the surfaces of the micro light-emitting devices due to the cohesion of the light-shielding material liquid itself, and therefore, the upper surfaces of the micro light-emitting devices are exposed from the light-shielding layer without being shielded. The preparation steps of the display panel in this embodiment may be shown in steps (a) to (f) in FIG. 11, including: (g) providing the display substrate→(h) dripping or spin coating the light-shielding material liquid→ (i) curing the light-shielding material liquid to form the light-shielding layer→(j) manufacturing the planarization layer→(k) forming the conductive through-holes→(l) covering the transparent sensing circuit layers. Comparing the steps in FIG. 10 and FIG. 11, it can be seen that the process of step S32 is adopted in step S3, which saves the polishing step and is simpler than the process of step S31.

The above embodiment of the disclosure can be used to prepare the display panel described in the first embodiment, which has the effect of simple process and the same beneficial effect as the first embodiment, which will not be described in detail herein.

Fourth Embodiment

The fourth embodiment of the disclosure provides a preparation method of a display panel. Referring to FIG. 9, the preparation method of the display panel provided by this embodiment may include step S1 and step S2. In the step S1, a display substrate is provided, the display substrate includes a driving array layer and multiple micro light-emitting devices, and the multiple micro light-emitting devices are in contact with and electrically connected to the driving array layer. In the step S2, a capacitive touch sensing structure is formed on a side of the display substrate adjacent to the multiple micro light-emitting devices, so that the capacitive touch sensing structure is spaced apart from the multiple micro light-emitting devices and electrically connected to the driving array layer.

The display substrate provided in the step S1 may have the same structure as the display substrate 11 described in the first embodiment and the second embodiment, which will not be described in detail herein. In a specific implementation, the step S2 may specifically include step S23, in the step 23, a capacitive touch sensing structure is formed between two adjacent target micro light-emitting devices of the multiple micro light-emitting devices. The target micro light-emitting device may be part or all of the multiple micro light-emitting devices, that is, the capacitive touch sensing structure may be formed only between some micro light-emitting devices of the multiple micro light-emitting devices, or between any two adjacent micro light-emitting devices, and which is not limited herein.

Before the step S23, the preparation method may further include step S3, in the step S3, a light-shielding layer is manufactured between the multiple micro light-emitting devices and sides of the micro light-emitting devices facing away from the driving array layer are exposed. Alternatively, in some implementations, the step S3 may be performed after the step S23, for example. The step S23 is executed before the step S3 and is available for preparing the structure of the display panel 10 as shown in the aforementioned FIGS. 2 and 3. The step S23 is executed after the step S3 and is available for preparing the structure of the display panel 10 as shown in the aforementioned FIG. 4. Before the step S23, the preparation method may include the step of forming conductive through-holes, so that the capacitive touch sensing structure can be electrically connected to the driving array layer through the conductive through-holes.

Figure 6:
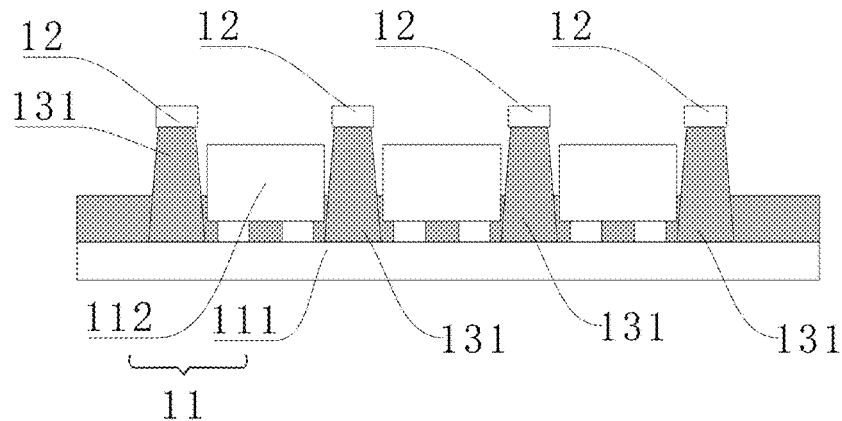
FIG. 6 illustrates a schematic structural view of a specific embodiment of the display panel shown in FIG. 4.
Figure 7:
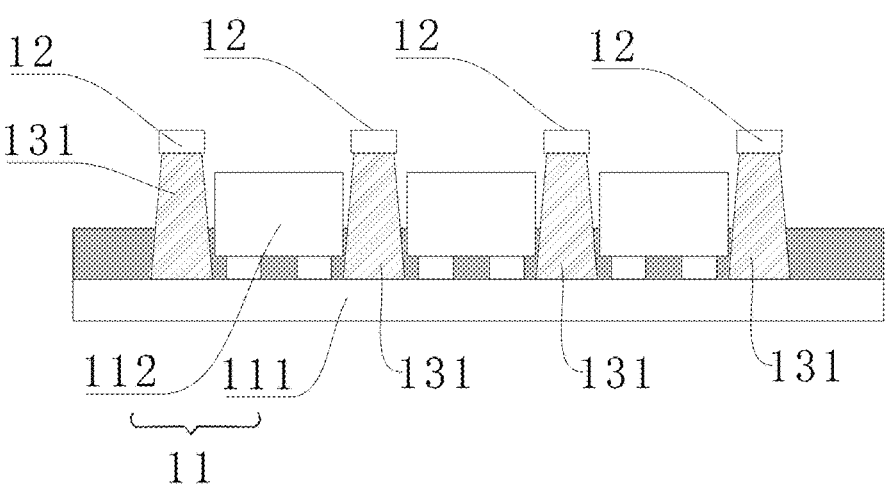
FIG. 7 illustrates a schematic structural view of a specific embodiment of the display panel shown in FIG. 6.

Further, in another implementation, the step S3 may further include step S33. In the step 33, multiple isolation columns are formed on the light-shielding layer, so that one isolation column is formed between any two adjacent micro light-emitting devices, and a height of each isolation column protruding from the driving array layer is not less than that of the multiple micro light-emitting devices protruding from the driving array layer. The multiple isolation columns can be formed by etching the light-shielding layer after patterning design. The crosstalk between adjacent micro light-emitting devices is blocked by the isolation columns, and the upper surfaces of the micro light-emitting devices are exposed, so that the micro light-emitting devices emit light upwards. Alternatively, in some implementations, the light reflecting material can be used to form the isolation columns, so that the light emitted by the micro light-emitting devices can be recovered as much as possible. For example, the light reflecting material can be realized by metal reflecting materials such as silver (Ag) or chromium (Cr), distributed Bragg reflection (DBR) materials, or a mixture of titanium dioxide ($TiO_2$) nanoparticles. Similarly, the step S33 can be executed after the step S23, which can be used to prepare the display panel as shown in FIG. 5. For example, step S33 can also be executed before the step S23, the step S23 specifically includes step S231: forming the capacitive touch sensing structure on a side of a target isolation column in the multiple isolation columns facing away from the driving array layer, which can be used to prepare the display panel as shown in FIG. 6 or FIG. 7.

The preparation method of the display panel provided by this embodiment can be used to prepare the display panel 10 as described in the aforementioned second embodiment, and therefore it has the same beneficial effects as the second embodiment.

Fifth Embodiment

Figure 12:
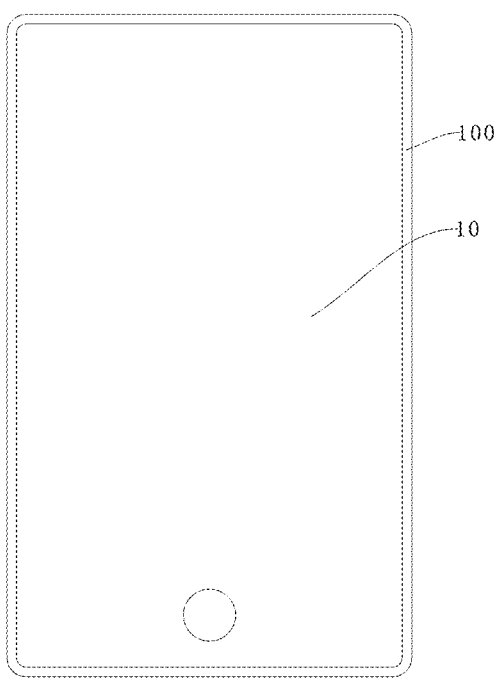
FIG. 12 illustrates a schematic structural view of a display device according to an embodiment of the disclosure.

Referring to FIG. 12, the fifth embodiment of the disclosure provides a display device 100, which may include any one of the display panels 10 described in the aforementioned first and second embodiments. For example, the display device 100 may be any electronic product with a display function and a touch function, including but not limited to a television, a notebook computer, a desktop display, a tablet computer, a digital camera, a smart bracelet, smart glasses, a vehicle-mounted display, medical equipment, an industrial control device, a touch interactive terminal and the like, and the implementation of the disclosure does not limit this. The display device 100 adopts the display panel 10 described in the aforementioned embodiments, and therefore it has the same beneficial effects as the aforementioned embodiments.

The above is only the illustrated embodiments of the disclosure, and is not intended to limit the disclosure in any form. Although the disclosure has been disclosed by the illustrated embodiments, it is not intended to limit the disclosure. Any person skilled in the art can make some changes or modifications into an equivalent embodiment by using the technical content disclosed above without departing from the scope of the technical solution of the disclosure. Any modifications, equivalent variations, and embellishments made to the above embodiments based on the technical essence of the disclosure without departing from the content of the technical solution of the disclosure still fall within the scope of the technical solution of the disclosure.

What is claimed is:

1. A display panel comprising:
a display substrate, comprising a driving array layer and a plurality of micro light-emitting devices, wherein the micro light-emitting devices are in contact with and electrically connected to the driving array layer;
a capacitive touch sensing structure, located at a side of the driving array layer adjacent to the plurality of micro light-emitting devices and spaced apart from the plurality of micro light-emitting devices, and the capacitive touch sensing structure being electrically connected to the driving array layer;
a light-shielding layer, arranged between the plurality of micro light-emitting devices and exposing sides of the plurality of micro light-emitting devices facing away from the driving array layer;
a planarization layer, covering the light-shielding layer and the sides of the plurality of micro light-emitting devices facing away from the driving array layer; and
conductive through-holes, penetrating through the planarization layer and the light-shielding layer and extending to the driving array layer;
wherein the capacitive touch sensing structure comprises transparent sensing circuit layers, and the transparent sensing circuit layers cover a side of the planarization layer facing away from the light-shielding layer and is electrically connected to the driving array layer through the conductive through-holes.

2. The display panel as claimed in claim 1, wherein the capacitive touch sensing structure is arranged in the light-shielding layer and between the plurality of micro light-emitting devices.

3. The display panel as claimed in claim 1, wherein the capacitive touch sensing structure is arranged on a side of the light-shielding layer facing away from the driving array layer and between the plurality of micro light-emitting devices.

4. The display panel as claimed in claim 1, wherein the light-shielding layer comprises a plurality of isolation columns protruding from the driving array layer along a direction close to sides of the plurality of micro light-emitting devices, and one isolation column of the plurality of the isolation columns is correspondingly arranged between any two adjacent micro light-emitting devices of the plurality of micro light-emitting devices, and a height of each of the plurality of isolation columns protruding from the driving array layer is not less than that of the plurality of micro light-emitting devices protruding from the driving array layer.

5. The display panel as claimed in claim 4, wherein the capacitive touch sensing structure is correspondingly arranged on a side of a target isolation column of the plurality of isolation columns facing away from the driving array layer.

6. The display panel as claimed in claim 4, wherein the plurality of isolation columns are made of light reflecting materials.

7. The display panel as claimed in claim 1, wherein an upper surface of the light-shielding layer is flush with upper surfaces of the plurality of micro light-emitting devices.

8. The display panel as claimed in claim 1, wherein a thickness between an upper surface of the planarization layer and an upper surface of the driving array layer is in a range of 7-15 micrometers ($\mu$m).

9. A display device, comprising the display panel as claimed in claim 1.

10. A preparation method of a display panel, comprising:
providing a display substrate, wherein the display substrate comprises a driving array layer and a plurality of micro light-emitting devices, and the plurality of micro light-emitting devices are in contact with and electrically connected to the driving array layer;
forming a capacitive touch sensing structure on a side of the display substrate adjacent to the plurality of micro light-emitting devices to make the capacitive touch sensing structure be spaced apart from the plurality of micro light-emitting devices and be electrically connected to the driving array layer, so as to obtain the display panel;
manufacturing a light-shielding layer between the plurality of micro light-emitting devices and exposing sides of the plurality of micro light-emitting devices facing away from the driving array layer;
manufacturing a planarization layer on a side of the light-shielding layer facing away from the driving array layer;
wherein the forming a capacitive touch sensing structure on a side of the display substrate adjacent to the plurality of micro light-emitting devices to make the capacitive touch sensing structure be spaced apart from the plurality of micro light-emitting devices and be electrically connected to the driving array layer comprises:
forming conductive through-holes penetrating through the planarization layer and the light-shielding layer; and
covering transparent sensing circuit layers on a side of the planarization layer facing away from the light-shielding layer, and making the transparent sensing circuit layers be electrically connected to the driving array layer through the conductive through-holes, thereby forming the capacitive touch sensing structure.

11. The preparation method as claimed in claim 10, wherein the manufacturing a light-shielding layer between the plurality of micro light-emitting devices and exposing sides of the plurality of micro light-emitting devices facing away from the driving array layer comprises:
covering a light-shielding film on the sides of the plurality of micro light-emitting devices facing away from the driving array layer and making the light-shielding film expose the sides of the plurality of micro light-emitting devices facing away from the driving array layer to form the light-shielding layer.

12. The preparation method as claimed in claim 10, wherein the manufacturing a light-shielding layer between the plurality of micro light-emitting devices and exposing sides of the plurality of micro light-emitting devices facing away from the driving array layer comprises:
filling a light-shielding material liquid between the plurality of micro light-emitting devices, making the light-shielding material liquid expose the sides of the plurality of micro light-emitting devices facing away from the driving array layer, and curing the light-shielding material liquid to form the light-shielding layer.

13. The preparation method as claimed in claim 10, wherein the forming a capacitive touch sensing structure on a side of the display substrate adjacent to the plurality of micro light-emitting devices to make the capacitive touch sensing structure be spaced apart from the plurality of micro light-emitting devices and be electrically connected to the driving array layer comprises:
forming the capacitive touch sensing structure between two adjacent target micro light-emitting devices of the plurality of micro light-emitting devices.

14. The preparation method as claimed in claim 13, further comprising:
forming a plurality of isolation columns on the light-shielding layer, making one isolation column of the plurality of isolation columns be formed between any two adjacent micro light-emitting devices of the plurality of micro light-emitting devices, and a height of each of plurality of isolation columns protruding from the driving array layer be not less than that of the plurality of micro light-emitting devices protruding from the driving array layer.

15. The preparation method as claimed in claim 14, wherein the forming the capacitive touch sensing structure between two adjacent target micro light-emitting devices of the plurality of micro light-emitting devices comprises:
forming the capacitive touch sensing structure on a side of a target isolation column of the plurality of isolation columns facing away from the driving array layer.

16. A display device, comprising the display panel prepared by the preparation method as claimed in claim 10.

\* \* \* \* \*